United States Patent
Chen

(10) Patent No.: US 10,223,971 B2
(45) Date of Patent: Mar. 5, 2019

(54) AMOLED PIXEL DRIVING CIRCUIT AND PIXEL DRIVING METHOD

(71) Applicant: Shenzhen China Star Optoelectronics Semiconductor Display Technology Co., Ltd., Shenzhen (CN)

(72) Inventor: Xiaolong Chen, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/572,797

(22) PCT Filed: Aug. 29, 2017

(86) PCT No.: PCT/CN2017/099386
§ 371 (c)(1),
(2) Date: Nov. 9, 2017

(65) Prior Publication Data
US 2019/0019454 A1   Jan. 17, 2019

(30) Foreign Application Priority Data
Jul. 11, 2017   (CN) .......................... 2017 1 0560647

(51) Int. Cl.
*G09G 3/3258* (2016.01)
*H01L 27/32* (2006.01)
*H01L 51/52* (2006.01)

(52) U.S. Cl.
CPC ....... *G09G 3/3258* (2013.01); *H01L 27/3244* (2013.01); *H01L 51/5206* (2013.01); *H01L 51/5221* (2013.01); *G09G 2310/0264* (2013.01)

(58) Field of Classification Search
CPC .......... G09G 3/3258; G09G 2310/0264; H01L 51/5221; H01L 51/5206; H01L 27/3244
See application file for complete search history.

(56) References Cited

U.S. PATENT DOCUMENTS

| | | | |
|---|---|---|---|
| 2014/0049169 A1* | 2/2014 | Li | H05B 33/0896 315/173 |
| 2016/0063943 A1* | 3/2016 | Lee | G09G 5/18 345/211 |
| 2016/0155383 A1* | 6/2016 | Chen | G09G 3/3233 345/211 |

* cited by examiner

*Primary Examiner* — Premal R Patel

(57) ABSTRACT

The present disclosure provides an AMOLED pixel driving circuit and pixel driving method, where the driving circuit includes: a drain of a fifth thin film transistor couples to another side of a second capacitor, a drain of a third thin film transistor, and a source of a first thin film transistor; a drain of a fourth thin film transistor couples to a drain of the first thin film transistor, a drain of a second thin film transistor and a drain of a sixth thin film transistor.

19 Claims, 7 Drawing Sheets

AMOLED PIXEL DRIVING CIRCUIT AND PIXEL DRIVING METHOD

RELATED APPLICATIONS

This application is a National Phase of PCT Patent Application No. PCT/CN2017/099386 having International filing date of Aug. 29, 2017, which claims the benefit of priority of Chinese Patent Application No. 201710560647.3 filed on Jul. 11, 2017. The contents of the above applications are all incorporated by reference as if fully set forth herein in their entirety.

FIELD AND BACKGROUND OF THE INVENTION

The present disclosure relates to the field of display technology, and more particularly to an active matrix organic light-emitting diode (AMOLED) pixel driving circuit and a pixel driving method.

Organic light emitting display (OLED) devices have become the display devices having the highest developmental potential due their advantages, such as self-illumination, low driving voltage, high illumination efficiency, short response period, high definition and high contrast, nearly 180 degree viewing angle, wide operating temperatures, flexible display, a large full-color display area, etc.

Conventional AMOLED pixel driving circuits are always 2T1C, which means being composed of two thin film transistors and one capacitor, for changing voltage into current.

Please refer to FIG. 1, the present AMOLED pixel driving circuit with a 2T1C structure comprises a first thin film transistor T10, a second thin film transistor T20, a capacitor C10, and an OLED D10. The first thin film transistor T10 is a driving thin film transistor, the second thin film transistor T20 is a switching thin film transistor, and the capacitor C10 is a storage capacitor. More specifically, a gate of the second thin film transistor T 20 receives a scanning signal Gate, a source of the second thin film transistor T 20 receives a data signal Data, and a drain of the second thin film transistor T 20 couples to a gate of the first thin film transistor T10. A source of the first thin film transistor T10 receives a positive voltage OVDD of a power source, a drain of the first thin film transistor T 10 couples to an anode of the OLED D10. The cathode of the OLED D10 receives a negative voltage OVSS of a power source. One side of the capacitor C10 couples to a gate of the first thin film transistor T10, another side of the capacitor C10 couples to a source of the first thin film transistor T10. While the 2T1C pixel driving circuit drives the AMOLED, the current flowing through the OLED D10 meets the following condition:

$$I=k\times(Vgs-Vth)^2,$$

where I represents a current flowing through the OLED D10, k represents an intrinsic conductive factor of the driving thin film transistor, Vgs represents the voltage difference between a gate and a source of the first thin film transistor T10, and Vth represents the threshold voltage of the first thin film transistor T10. Therefore, it can be seen that the current flowing through the OLED D10 relates to the threshold voltage for driving thin film transistors.

The threshold voltages for the driving the thin film transistors in each of the pixel driving circuits vary due to instability resulting from the manufacturing processes of panels. Therefore, the currents flowing into OLEDs will be different, even when the same data voltage on the driving thin film transistors is applied to each of the pixel driving circuits. As a result, consistency and image display quality will be affected. Once the driving duration becomes longer, materials of thin film transistor begin deteriorating and varying, then the threshold voltage for driving the thin film transistor will drift. Also, drifting variations of the threshold voltages of each of the driving thin film transistors are different due to deteriorating diversity of the materials. Those foregoing occasions leads to issues such as unevenness in the display, increase in starting voltage for driving the thin film transistors, decrease of the current flowing through the OLED, decline in luminosity, and decline of illuminating efficiency.

Therefore, an AMOLED pixel driving circuit and method is required to solve the problems of the present technology.

SUMMARY OF THE INVENTION

The object of this disclosure provides an AMOLED pixel driving circuit and pixel driving method which can enhance the consistency of the display, the luminosity of the panels, and the efficiency of illumination.

To solve the above-mentioned technical problems, the present disclosure provides an AMOLED pixel driving circuit which comprises:
  a first thin film transistor, a second thin film transistor, a third thin film transistor, a fourth thin film transistor, a fifth thin film transistor, a sixth thin film transistor, a first capacitor, a second capacitor, and an organic light-emitting diode (OLED); wherein
  a first thin film transistor, a second thin film transistor, a third thin film transistor, a fourth thin film transistor, a fifth thin film transistor, a sixth thin film transistor, a first capacitor, a second capacitor, and an organic light-emitting diode (OLED); wherein
  a gate of the fifth thin film transistor receives a third scanning signal, a source of the fifth thin film transistor receives a positive voltage of a power source, a drain of the fifth thin film transistor is coupled to one side of the second capacitor, a drain of the third thin film transistor, and a source of the first thin film transistor; another side of the second capacitor is coupled to one side of the first capacitor; another side of the first capacitor is grounded;
  a gate of the third thin film transistor receives a first scanning signal, a source of the third thin film transistor and a source of the fourth thin film transistor receive a data voltage or an initialization voltage; a gate of the fourth thin film transistor receives a second scanning signal; a drain of the fourth thin film transistor is coupled to a drain of the first thin film transistor, a drain of the second thin film transistor, and a drain of the sixth thin film transistor;
  a gate of the first thin film transistor is coupled to a node between the second capacitor and the first capacitor;
  a source of the second thin film transistor is coupled to a node between the second capacitor and the first capacitor; a gate of the second thin film transistor receives the first scanning signal;
  a gate of the sixth thin film transistor receives the third scanning signal; a source of the sixth thin film transistor is coupled to an anode of the OLED; a cathode of the OLED receives a negative voltage of the power source;
  the first thin film transistor is a driving thin film transistor, the sixth thin film transistor is a switching thin film transistor;

the first thin film transistor, the second thin film transistor, the third thin film transistor, the fourth thin film transistor, the fifth thin film transistor, and the sixth thin film transistor are P-type thin film transistors.

In the AMOLED pixel driving circuit of the present disclosure, the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

In the AMOLED pixel driving circuit of the present disclosure, the first scanning signal, the second scanning signal, and the third scanning signal correspond to a initializing stage, a threshold voltage storing stage, and a light illuminating stage respectively;
  in the initializing stage, the first scanning signal and the second scanning signal are at a low potential, the third scanning signal is at a high potential;
  in the threshold voltage storing stage, the first scanning signal is at a low potential, the second scanning signal and the third scanning signal are at a high potential;
  in the light illuminating stage, the first scanning signal and the second scanning signal are at a high potential, the third scanning signal is at a low potential.

In the AMOLED pixel driving circuit of the present disclosure, in the initializing stage, a source of the third thin film transistor and a source of the fourth thin film transistor receive the initialization voltage;
  in the threshold voltage storing stage and the light illuminating stage, a source of the third thin film transistor and a source of the fourth thin film transistor receive the data voltage.

In the AMOLED pixel driving circuit of the present disclosure, the first scanning signal, the second scanning signal, and the third scanning signal are generated from an external timing controller.

To solve the above-mentioned technical problems, the present disclosure provides an AMOLED pixel driving circuit which comprises:
  a first thin film transistor, a second thin film transistor, a third thin film transistor, a fourth thin film transistor, a fifth thin film transistor, a sixth thin film transistor, a first capacitor, a second capacitor, and an organic light-emitting diode (OLED); wherein
  a first thin film transistor, a second thin film transistor, a third thin film transistor, a fourth thin film transistor, a fifth thin film transistor, a sixth thin film transistor, a first capacitor, a second capacitor, and an organic light-emitting diode (OLED); wherein
  a gate of the fifth thin film transistor receives a third scanning signal, a source of the fifth thin film transistor receives a positive voltage of a power source, a drain of the fifth thin film transistor is coupled to one side of the second capacitor, a drain of the third thin film transistor, and a source of the first thin film transistor;
  another side of the second capacitor is coupled to one side of the first capacitor; another side of the first capacitor is grounded;
  a gate of the third thin film transistor receives a first scanning signal, a source of the third thin film transistor and a source of the fourth thin film transistor receive a data voltage or an initialization voltage; a gate of the fourth thin film transistor receives a second scanning signal; a drain of the fourth thin film transistor is coupled to a drain of the first thin film transistor, a drain of the second thin film transistor, and a drain of the sixth thin film transistor;
  a gate of the first thin film transistor is coupled to a node between the second capacitor and the first capacitor;
  a source of the second thin film transistor is coupled to a node between the second capacitor and the first capacitor; a gate of the second thin film transistor receives the first scanning signal;
  a gate of the sixth thin film transistor receives the third scanning signal; a source of the sixth thin film transistor is coupled to an anode of the OLED; a cathode of the OLED receives a negative voltage of the power source.

In the AMOLED pixel driving circuit of the present disclosure, the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

In the AMOLED pixel driving circuit of the present disclosure, the first thin film transistor, the second thin film transistor, the third thin film transistor, the fourth thin film transistor, the fifth thin film transistor, and the sixth thin film transistor are P-type thin film transistors.

In the AMOLED pixel driving circuit of the present disclosure, the first scanning signal, the second scanning signal, and the third scanning signal correspond to an initializing stage, a threshold voltage storing stage, and a light illuminating stage respectively;
  in the initializing stage, the first scanning signal and the second scanning signal are at a low potential, the third scanning signal is at a high potential;
  in the threshold voltage storing stage, the first scanning signal is at a low potential, the second scanning signal and the third scanning signal are at a high potential;
  in the light illuminating stage, the first scanning signal and the second scanning signal are at a high potential, the third scanning signal is at a low potential.

In the AMOLED pixel driving circuit of the present disclosure, in the initializing stage, a source of the third thin film transistor and a source of the fourth thin film transistor receive the initialization voltage;
  in the threshold voltage storing stage and the light illuminating stage, a source of the third thin film transistor and a source of the fourth thin film transistor receive the data voltage.

In the AMOLED pixel driving circuit of the present disclosure, the first thin film transistor is a driving thin film transistor, the sixth thin film transistor is a switching thin film transistor.

In the AMOLED pixel driving circuit of the present disclosure, the first scanning signal, the second scanning signal, and the third scanning signal are generated from an external timing controller.

The present disclosure further provides an AMOLED pixel driving method which comprises:
  providing an AMOLED pixel driving circuit;
  entering an initializing stage;
  entering a threshold voltage storing stage; and
  entering a light illuminating stage;
  wherein the AMOLED pixel driving circuit comprises:
  a first thin film transistor, a second thin film transistor, a third thin film transistor, a fourth thin film transistor, a fifth thin film transistor, a sixth thin film transistor, a first capacitor, a second capacitor, and an organic light-emitting diode (OLED);

a gate of the fifth thin film transistor receives a third scanning signal, a source of the fifth thin film transistor receives a positive voltage of a power source, a drain of the fifth thin film transistor is coupled to one side of the second capacitor, a drain of the third thin film transistor, and a source of the first thin film transistor;

another side of the second capacitor is coupled to one side of the first capacitor; another side of the first capacitor is grounded;

a gate of the third thin film transistor receives a first scanning signal, a source of the third thin film transistor and a source of the fourth thin film transistor receive a data voltage or a initialization voltage; a gate of the fourth thin film transistor receives a second scanning signal; a drain of the fourth thin film transistor is coupled to a drain of the first thin film transistor, a drain of the second thin film transistor, and a drain of the sixth thin film transistor;

a gate of the first thin film transistor is coupled to a node between the second capacitor and the first capacitor;

a source of the second thin film transistor is coupled to a node between the second capacitor and the first capacitor; a gate of the second thin film transistor receives the first scanning signal;

a gate of the sixth thin film transistor receives the third scanning signal; a source of the sixth thin film transistor is coupled to an anode of the OLED; a cathode of the OLED receives a negative voltage of the power source;

in the initializing stage, the first scanning signal provides a low potential, the second thin film transistor and the third thin film transistor are on; the second scanning signal provides a low potential, the fourth thin film transistor is on; the third scanning signal provides a high potential, the fifth thin film transistor and the sixth thin film transistor are off; a voltage of the gate of the first thin film transistor and a voltage of the source of the first thin film transistor are equal to the initialization voltage;

in the threshold voltage storing stage, the first scanning signal provides a low potential, the second thin film transistor and the third thin film transistor are on; the second scanning signal provides a high potential, the fourth thin film transistor is off; the third scanning signal provides a high potential, the fifth thin film transistor and the sixth thin film transistor are off; a voltage of the source of the first thin film transistor is equal to the data voltage, a voltage of the gate of the first thin film transistor changes into Vdata−Vth, wherein the Vdata is the data voltage, Vth is a threshold voltage of the first thin film transistor;

in the light illuminating stage, the first scanning signal provides a high potential, the second thin film transistor and the third thin film transistor are off; the second scanning signal provides a high potential, the fourth thin film transistor is off; the third scanning signal provides a low potential, the fifth thin film transistor and the sixth thin film transistor are on; the OLED illuminates, wherein an electric current flowing through the OLED is irrelevant to the threshold voltage of the first thin film transistor.

In the AMOLED pixel driving circuit of the present disclosure, in the light illuminating stage, a voltage applied to the source of the first thin film transistor changes into the positive voltage of the power source, and a voltage applied to the gate of the first thin film transistor changes into Vdata−Vth+δV so that electric current flowing through the OLED is irrelevant to the threshold voltage of the first thin film transistor, wherein δV is a variation of the voltage applied to the gate of the first thin film transistor as the voltage applied to the source of the first thin film transistor changing from the data voltage to the positive voltage of the power source.

In the AMOLED pixel driving circuit of the present disclosure, in the initializing stage, a source of the third thin film transistor and a source of the fourth thin film transistor receive the initialization voltage;

in the threshold voltage storing stage and the light illuminating stage, a source of the third thin film transistor and a source of the fourth thin film transistor receive the data voltage.

In the AMOLED pixel driving circuit of the present disclosure, the first scanning signal, the second scanning signal, and the third scanning signal are generated from an external timing controller.

In the AMOLED pixel driving circuit of the present disclosure, the first thin film transistor is a driving thin film transistor, the sixth thin film transistor is a switching thin film transistor.

In the AMOLED pixel driving circuit of the present disclosure, the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

In the AMOLED pixel driving circuit of the present disclosure, the first thin film transistor, the second thin film transistor, the third thin film transistor, the fourth thin film transistor, the fifth thin film transistor, and the sixth thin film transistor are P-type thin film transistors.

By improving the present pixel driving circuit, the AMOLED pixel driving circuit and the pixel driving method of the present disclosure eliminates the affection to the OLED caused by the threshold voltage of driving thin film transistor. Also, the unevenness of the display is improved. In addition, the problems of the panels accompanying the deterioration of OLED components, such as the decline of the illumination and illuminating efficiency, can be avoided.

BRIEF DESCRIPTION OF THE SEVERAL VIEW OF THE DRAWINGS

DESCRIPTION OF SPECIFIC EMBODIMENTS OF THE INVENTION

The illustrations of the following embodiments take the attached drawings as reference to indicate the applicable specific examples of the present disclosure. The mentioned directional terms, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto. Units having similar structures are numbered the same.

The general solutions, which aim to drifting threshold voltage for driving the thin film transistor (TFT), are improving the AMOLE pixel driving circuit by increasing the number of the thin film transistors and the number of control signals, in order to compensate the threshold voltages for driving the thin film transistors. Therefore, the currents flowing through the OLED can be irrelevant to the threshold voltage for driving the thin film transistors when the OLED illuminates.

Figure 1:
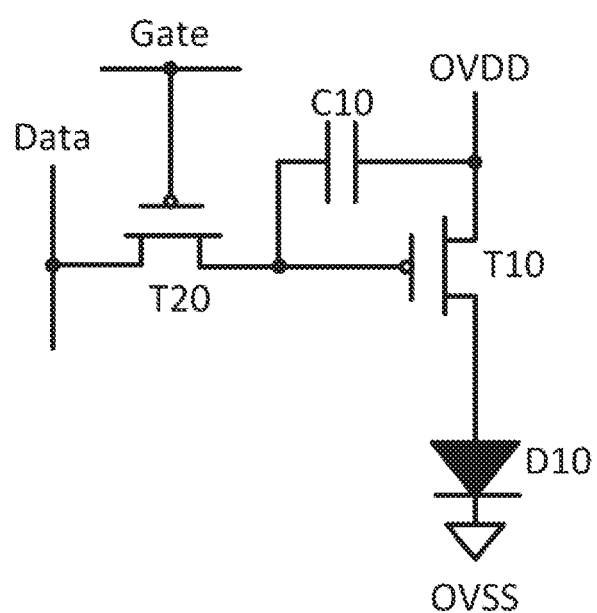
FIG. 1 illustrates a circuit diagram of the present 2T1C pixel driving circuit applied to an AMOLED.
Figure 2:
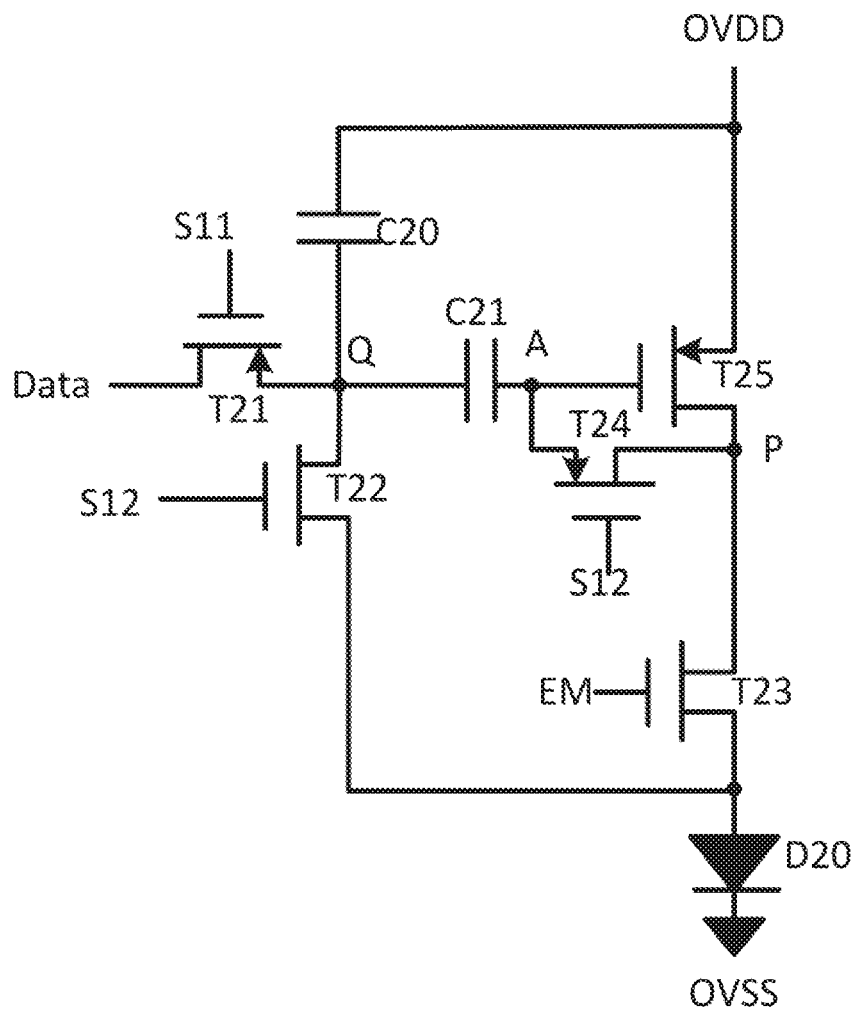
FIG. 2 illustrates a circuit diagram of the present 5T2C pixel driving circuit applied to an AMOLED.

Please refer to FIG. 2 which illustrates an AMOLED pixel driving circuit adopting the 5T2C structure, i.e., the structure is composed of five thin film transistors and two capacitors. The 5T2C structure comprises a first thin film transistor T21, a second thin film transistor T22, a third thin film transistor T23, a fourth thin film transistor T24, a fifth thin film transistor T25, a first capacitor C20, a second capacitor C21, and an OLED D20. The particular connections are: a gate of the first thin film transistor T21 receives a scanning signal S11, a source of the first thin film transistor T21 receives a data signal Data, a drain of the first thin film transistor T21 couples to a first node Q, a gate of the second thin film transistor T22 receives a scanning signal S12, a source of the second thin film transistor T22 couples to the first node Q, and a drain of the second thin film transistor T22 couples to the anode of the OLED D20.

One side of the first capacitor C20 connects to the first node Q, the another side of the first capacitor C20 receives a positive voltage OVDD of a power source, one side of the second capacitor C21 connects to the first node Q, the another side of the second capacitor C21 couples to a gate of the fifth thin film transistor T25 and a source of the fourth thin film transistor T24, a drain of the fourth thin film transistor T24 couples to the second node P, a gate of the fourth thin film transistor T24 receives the second scanning signal S12, a source of the fifth thin film transistor T25 receives a positive voltage OVDD of a power source, a drain of the fifth thin film transistor T25 couples to a second node P, a gate of the third thin film transistor T23 receive a emitting signal EM, a source of the third thin film transistor T23 couples to the second node P, a drain of the third thin film transistor T23 couples to the anode of the OLED D20, and the cathode of the OLED D20 couples to a negative voltage OVSS of a power source.

Although the above-mentioned 5T2C structure can eliminate the Vth for driving the thin film transistor; however, the potential of node A still remains in Vdata+OVDD−Vth−Vref in the Data Writing stage and the Emission stage, where Vref is a reference voltage. The luminosity of OLEDs in every pixel are various due to the unevenness of the OLEDs in the panel. Therefore, if Vref becomes too high, OLEDs will illuminate during resetting stage. If Vref becomes too low, the potential of node A in the Data Writing stage and the Emission stage becomes too high, and the driving thin film transistors will be lead to cut-off status so that the value of Vref becomes unstable.

Figure 3:
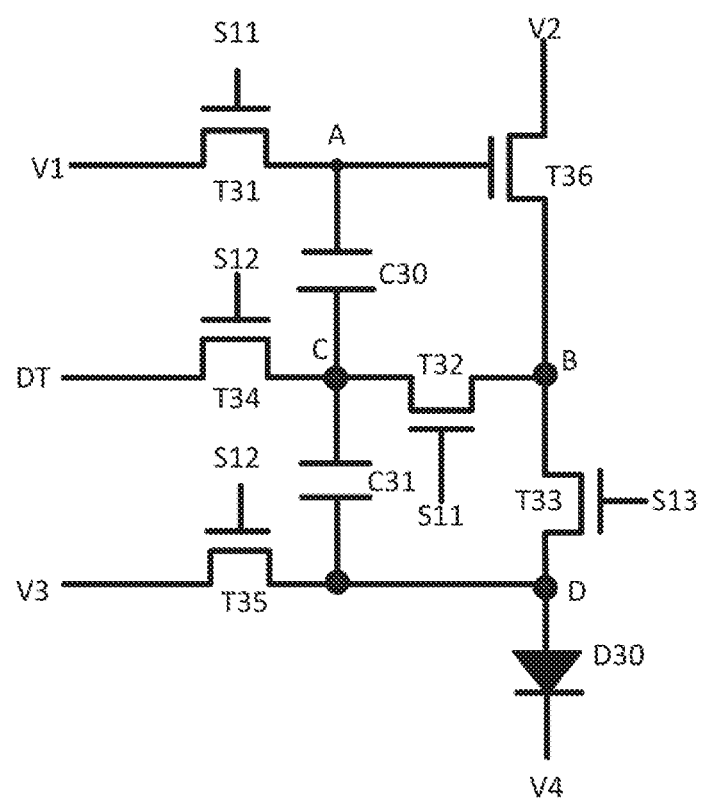
FIG. 3 illustrates a circuit diagram of the present 6T2C pixel driving circuit applied to AMOLED.

FIG. 3 illustrates another type of AMOLED pixel driving circuit adopting a 6T2C structure, i.e., a structure composed by six thin film transistors and two capacitors. The 6T2C structure comprises a first thin film transistor T31, a second thin film transistor T32, a third thin film transistor T33, a fourth thin film transistor T34, a fifth thin film transistor T35, a sixth thin film transistor T36, a first capacitor C30, a second capacitor C31, and an OLED D30. The particular connections are: a gate of the first thin film transistor T31 receives a scanning signal S11, a source of the first thin film transistor T31 receives a first voltage V1, a drain of the first thin film transistor T31 couples to a first node A. a source of the sixth thin film transistor T36 receives a second voltage V2, a gate of the sixth thin film transistor T36 couples to the first node A, a drain of the sixth thin film transistor T36 couples to a second node B, a source of the fourth thin film transistor T34 receives a signal DR, a gate of the fourth thin film transistor T34 receives a scanning signal S12, a drain of the fourth thin film transistor T34 couples to a third node C, a gate of the second thin film transistor T32 receives the scanning signal S11, a source of the second thin film transistor T32 couples to the third node C, and a drain of the second thin film transistor T32 couples to the node B, one side of the first capacitor C30 couples to the first node A, the another side of the first capacitor C30 couples to the third node C, one side of the second capacitor C21 couples to the third node C, another side of the second capacitor C31 couples to a drain of the fifth thin film transistor T35.

A source of the fifth thin film transistor T35 receives a third voltage V3, a gate of the fifth thin film transistor T35 receives the scanning signal S12, a drain of the fifth thin film transistor T35 couples to a fourth node D.

A source of the third thin film transistor T33 couples to the second node B, a gate of the third thin film transistor T33 receives a third scanning signal S13, a drain of the third thin film transistor T33 couples to the fourth node D.

A cathode of the OLED D30 couples to the fourth node D, an anode of the OLED D30 receives a fourth voltage V4.

Although the above-mentioned 6T2C structure can eliminate the Vth for driving the thin film transistor; however, two extra power sources V1 and V3 are required. Therefore, the more inputting signals there are the more complex will the hardware design be.

Figure 4:
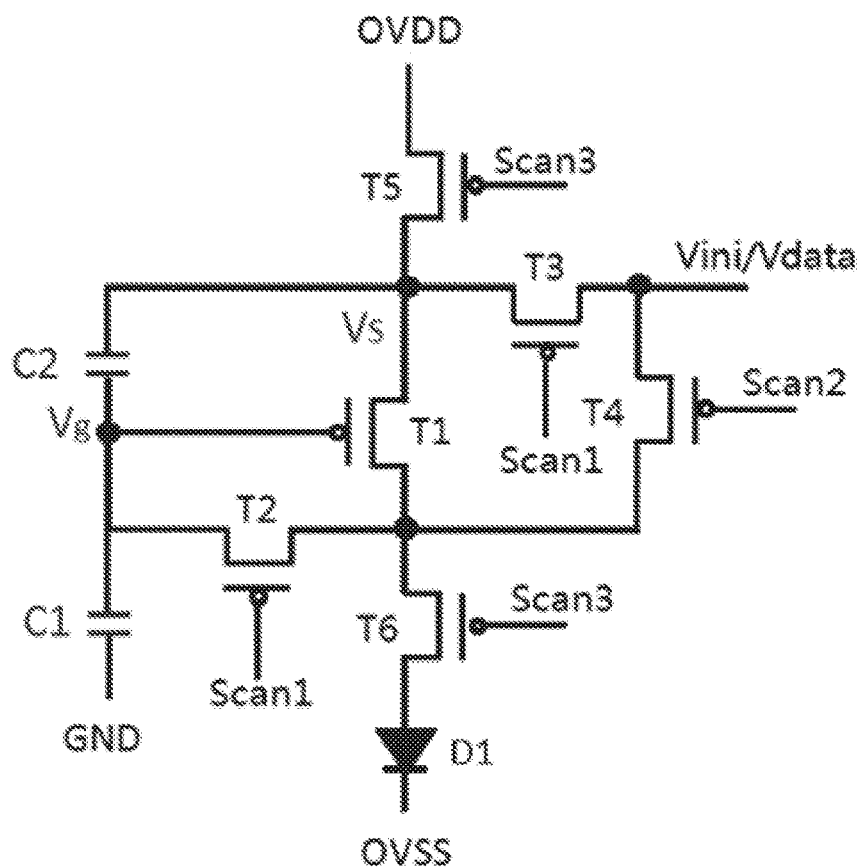
FIG. 4 illustrates a circuit diagram of an AMOLED pixel driving circuit of the present disclosure.

Please refer to FIG. 4 which illustrates the circuit diagram of the AMOLED pixel driving circuit of the present disclosure.

As shown in FIG. 4, the AMOLED pixel driving circuit of the present disclosure comprises a first thin film transistor T1, a second thin film transistor T2, a third thin film transistor T3, a fourth thin film transistor T4, a fifth thin film transistor T5, a sixth thin film transistor T6, a first capacitor C1, a second capacitor C2, and an OLED D1, where the first thin film transistor T1 is a driving thin film transistor and the sixth thin film transistor T6 is a switching thin film transistor.

The particular connections of each component are as follows: a gate of the fifth thin film transistor T5 receives a third scanning signal Scan3, a source of the fifth thin film transistor T5 receives a positive voltage OVDD of a power source, a drain of the fifth thin film transistor T5 is coupled to one side of the second capacitor C2, a drain of the third thin film transistor T3, and a source of the first thin film transistor T1.

Another side of the second capacitor C2 is coupled to one side of the first capacitor C1; another side of the first capacitor C1 is grounded.

A gate of the third thin film transistor T3 receives a first scanning signal Scan1, a source of the third thin film transistor T3 and a source of the fourth thin film transistor T4 receive a data voltage or an initialization voltage; a gate of the fourth thin film transistor T4 receives a second scanning signal Scan2; a drain of the fourth thin film transistor T4 is coupled to a drain of the first thin film transistor T1, a drain of the second thin film transistor T2, and a drain of the sixth thin film transistor T6.

A gate of the first thin film transistor T1 is coupled to a node between the second capacitor C2 and the first capacitor C2.

A gate of the second thin film transistor T2 receives the first scanning signal Scan1. A source of the second thin film transistor T2 is coupled to a node between the second capacitor C2 and the first capacitor C1.

A gate of the sixth thin film transistor T6 receives the third scanning signal Scan3. A source of the sixth thin film transistor T6 is coupled to an anode of the OLED D1. A cathode of the OLED receives a negative voltage OVSS of the power source.

The first thin film transistor T1, the second thin film transistor T2, the third thin film transistor T3, the fourth thin film transistor T4, the fifth thin film transistor T5, and the sixth thin film transistor T6 are low temperature poly-silicon thin film transistors, oxide semiconductor thin film transistors, or amorphous silicon thin film transistors.

The first scanning signal Scan1, the second scanning signal Scan2, and the third scanning signal Scan3 are generated from an external timing controller.

The first thin film transistor T1, the second thin film transistor T2, the third thin film transistor T3, the fourth thin film transistor T4, the fifth thin film transistor T5, and the sixth thin film transistor T6 are P-type thin film transistors.

The first scanning signal Scan1, the second scanning signal Scan2, and the third scanning signal Scan3 correspond to an initializing stage, a threshold voltage storing stage, and a light illuminating stage respectively;

in the initializing stage, a source of the third thin film transistor T3 and a source of the fourth thin film transistor T4 receive the initialization voltage Vini;

in the threshold voltage storing stage and the light illuminating stage, a source of the third thin film transistor T3 and a source of the fourth thin film transistor T4 receive the data voltage Vdata.

On the basic of above-mentioned AMOLED pixel driving circuit, the present disclosure further provides an AMOLED pixel driving method comprising the following steps:

Step S101, providing an AMOLED pixel driving circuit. Please refer to FIG. 4 and the context above for the specific content.

Step S102, entering the initialization stage.

Figure 5:
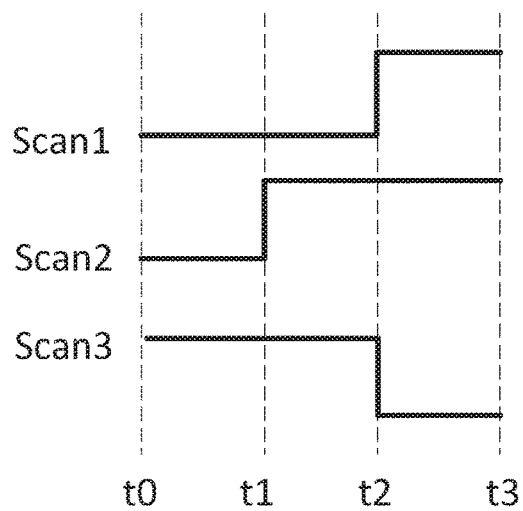
FIG. 5 illustrates a timing diagram of an AMOLED pixel driving circuit of the present disclosure.
Figure 6:
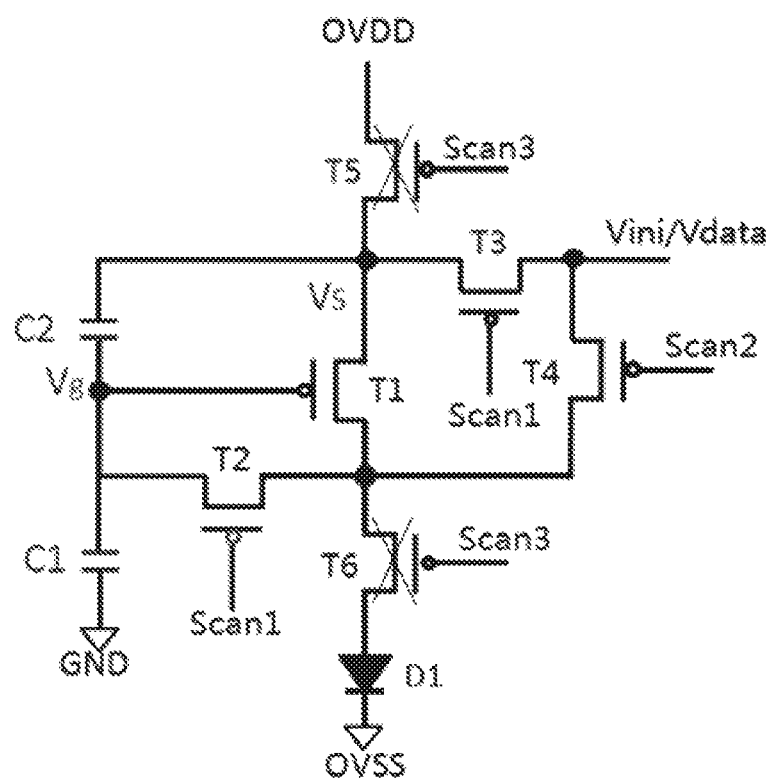
FIG. 6 illustrates step 2 of an AMOLED pixel driving method of the present disclosure.

As shown in FIG. 5, together with FIG. 6, in the initialization stage, i.e., during the period t0-t1, the first scanning signal Scan1 and the second scanning signal Scan2 are at a low potential, the third scanning signal Scan3 is at a high potential.

The first scanning signal Scan1 provides a low potential to make the second thin film transistor T2 and the third thin film transistor T3 being on. The second scanning signal Scan2 provides a low potential, and the fourth thin film transistor T4 is on. The third thin film transistor T3 provides a high potential, and the fifth thin film transistor T5 and the sixth thin film transistor T6 are off.

Because the third thin film transistor T3 is on and the fifth thin film transistor T5 if off, Vnin charges to a source of the first thin film transistor T1 (node s) to make the voltage (Vs) of a source of the first thin film transistor T1 equal to the initialization voltage Vini.

Because the fourth thin film transistor T4 and the second thin film transistor T2 are on, and the sixth thin film transistor T6 is off, Vini charge to a gate of the first thin film transistor T1 (node g). The voltage Vg of a gate of the first thin film transistor T1 equals to the initialization voltage Vini.

The OLED D1 does not illuminate because the sixth thin film transistor T6 is off. The initialization to the potentials of the node g and the node s is completed in this stage.

Step S103, entering threshold voltage storing stage.

Figure 7:
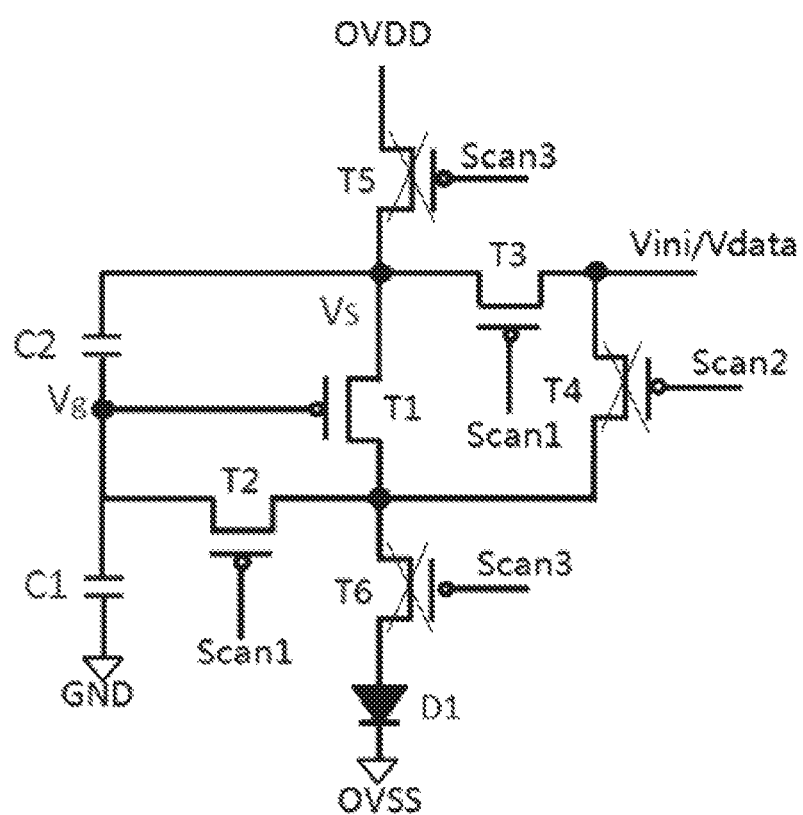
FIG. 7 illustrates step 3 of the AMOLED pixel driving method of the present disclosure.

As shown in FIG. 5, together with FIG. 7, in the threshold voltage storing is stage, i.e. during the period t1-t2, the first scanning signal Scan1 is at a low potential. The second scanning signal Scan2 and the third scanning signal Scan3 are at a high potential.

Because the first scanning signal Scan1 provides a low potential, it makes the second thin film transistor T2 and the third thin film transistor T3 are on. The second scanning signal Scan2 provides a high potential to make the fourth thin film transistor T4 being off. The third scanning signal Scan3 provides a high potential to make the fifth thin film transistor T5 and the sixth thin film transistor T6 being off.

Because the third thin film transistor T3 is on and the fifth thin film transistor T5 is off, so that the data voltage Vdata charges to a gate of the first thin film transistor T1 (node s). The gate voltage (Vs) of the first thin film transistor T1 equals to the data voltage Vdata.

Because the second thin film transistor T2 is on, and the third thin film transistor T4 and the sixth thin film transistor T6 are off, the potential of node g keeps discharging through the first thin film transistor T1, the second thin film transistor T2, and the third thin film transistor T3 until the differential voltage between the node g and node s reaches the threshold voltage for driving the thin film transistor T1, i.e., Vth.

Vg and Vs satisfy the following formula:

$$Vs-Vg=Vth,$$

where Vs=Vdata,

Therefore, Vg=Vdata−Vth.

The OLED D1 does not illuminate because the sixth thin film transistor T6 is off. The potential storage of the threshold voltage Vth is completed in this stage.

Step S104, entering the light illuminating stage.

Figure 8:
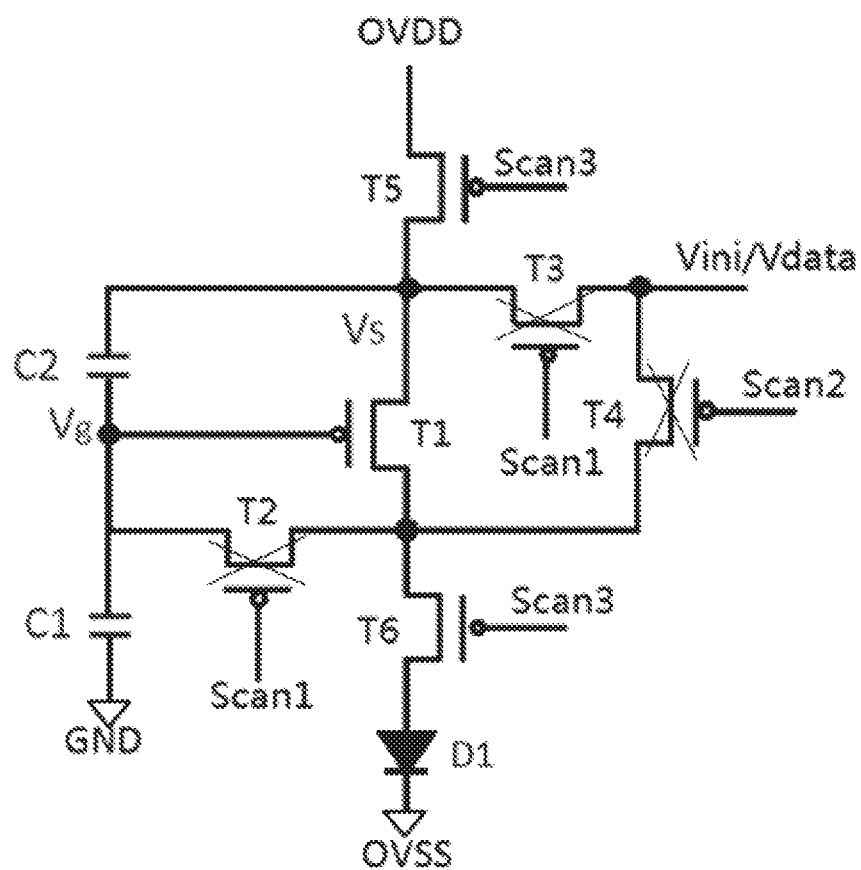
FIG. 8 illustrates step 4 of the AMOLED pixel driving method of the present disclosure.

As shown in FIG. 5, together with FIG. 8, in the light illuminating stage, i.e., during the period of t2-t3, the first scanning signal Scan1 and the second scanning signal Scan2 are at a high potential, the third scanning signal Scan3 is at a low potential.

The first scanning signal Scan1 provides a high potential to make the second thin film transistor T2 and the third thin film transistor T3 being off. The second scanning signal Scan2 provides a high potential to make the fourth thin film transistor T4 being off. The third scanning signal Scan3 provides a low potential to make the fifth thin film transistor T5 and the sixth thin film transistor T6 being on. Because the sixth thin film transistor T6 is on, the OLED D1 illuminate where the current flowing through the OLED D1 is irrelevant to the threshold voltage of the first thin film transistor T1.

More particular, the third thin film transistor T3 is off and the fifth thin film transistor T5 is on thus the potential Vs of the node s changes into the positive voltage OVSS. The second thin film transistor T2 is off.

From the law of capacitive coupling, the potential of the node g (Vg) can be obtained as follows:

$$Vg=Vdata-Vth+\delta V,$$

where, $\delta V=(OVDD-Vdata)*C2/(C1+C2)$.

Where C1 represents the capacitance of the first capacitor and C2 represents the capacitance of the second capacitor, δV represents the variation of the voltage applied to the gate of the first thin film transistor T1 after the voltage applied to the source of the first thin film transistor T1 changing from the data voltage to the negative voltage of the power source.

The differential voltage Vsg between the node g and node s changes into the following status at this moment:

$$Vsg=Vs-Vg=\text{OVDD}-V\text{data}-\delta V+Vth.$$

The current flowing through the OLED D1 satisfies:

$$I=k(Vsg-Vth)2=k(\text{OVDD}-V\text{data}-\delta V)^2.$$

To conclude with the above formulas, the final current flowing through the OLED D1 becomes:

$$I=k[(\text{OVDD}-V\text{data})*C1/(C1+C2)]^2$$

As a result, the current of the OLED becomes irrelevant to the threshold voltage (Vth) for driving the first thin film transistor (T1). The affection to the OLED generated from the threshold voltage Vth will be eliminated. Thus, the unevenness and the illuminating efficiency of the displaying are enhanced.

By improving the present pixel driving circuit, the AMOLED pixel driving circuit and pixel driving method of the present disclosure eliminates the affection to the OLED caused from the threshold voltage for driving the thin film transistors. Also, the unevenness of displaying is improved. In addition, the problems of panels accompanying with the deterioration of OLED components, such as the decline of the illumination or the decline of the illuminating efficiency, can be avoided.

In conclusion, although this disclosure has been disclosed through the preferable embodiments above, the preferable embodiments above are not utilized to limit this disclosure. One having ordinary skills can change and modify without violating the concepts and scope of this disclosure. Therefore, the scope that this disclosure protects is based on the scope defined by the claims.

What is claimed is:

1. An active matrix organic light-emitting diode (AMOLED) pixel driving circuit comprising:
   a first thin film transistor, a second thin film transistor, a third thin film transistor, a fourth thin film transistor, a fifth thin film transistor, a sixth thin film transistor, a first capacitor, a second capacitor, and an organic light-emitting diode (OLED); wherein
   a gate of the fifth thin film transistor receives a third scanning signal, a source of the fifth thin film transistor receives a positive voltage of a power source, a drain of the fifth thin film transistor is coupled to one side of the second capacitor, a drain of the third thin film transistor, and a source of the first thin film transistor;
   another side of the second capacitor is coupled to one side of the first capacitor; another side of the first capacitor is grounded;
   a gate of the third thin film transistor receives a first scanning signal, a source of the third thin film transistor and a source of the fourth thin film transistor receive a data voltage or an initialization voltage; a gate of the fourth thin film transistor receives a second scanning signal; a drain of the fourth thin film transistor is coupled to a drain of the first thin film transistor, a drain of the second thin film transistor, and a drain of the sixth thin film transistor;
   a gate of the first thin film transistor is coupled to a node between the second capacitor and the first capacitor;
   a source of the second thin film transistor is coupled to a node between the second capacitor and the first capacitor; a gate of the second thin film transistor receives the first scanning signal;
   a gate of the sixth thin film transistor receives the third scanning signal; a source of the sixth thin film transistor is coupled to an anode of the OLED; a cathode of the OLED receives a negative voltage of the power source;
   the first thin film transistor is a driving thin film transistor, the sixth thin film transistor is a switching thin film transistor;
   the first thin film transistor, the second thin film transistor, the third thin film transistor, the fourth thin film transistor, the fifth thin film transistor, and the sixth thin film transistor are P-type thin film transistors.

2. The AMOLED pixel driving circuit according to claim 1, wherein the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

3. The AMOLED pixel driving circuit according to claim 1, wherein the first scanning signal, the second scanning signal, and the third scanning signal correspond to an initializing stage, a threshold voltage storing stage, and a light illuminating stage respectively;
   in the initializing stage, the first scanning signal and the second scanning signal are at a low potential, the third scanning signal is at a high potential;
   in the threshold voltage storing stage, the first scanning signal is at a low potential, the second scanning signal and the third scanning signal are at a high potential;
   in the light illuminating stage, the first scanning signal and the second scanning signal are at a high potential, the third scanning signal is at a low potential.

4. The AMOLED pixel driving circuit according to claim 3, wherein in the initializing stage, a source of the third thin film transistor and a source of the fourth thin film transistor receive the initialization voltage;
   in the threshold voltage storing stage and the light illuminating stage, a source of the third thin film transistor and a source of the fourth thin film transistor receive the data voltage.

5. The AMOLED pixel driving circuit according to claim 1, wherein the first scanning signal, the second scanning signal, and the third scanning signal are generated from an external timing controller.

6. An active matrix organic light-emitting diode (AMOLED) pixel driving circuit comprising:
   a first thin film transistor, a second thin film transistor, a third thin film transistor, a fourth thin film transistor, a fifth thin film transistor, a sixth thin film transistor, a first capacitor, a second capacitor, and an organic light-emitting diode (OLED); wherein
   a gate of the fifth thin film transistor receives a third scanning signal, a source of the fifth thin film transistor receives a positive voltage of a power source, a drain of the fifth thin film transistor is coupled to one side of the second capacitor, a drain of the third thin film transistor, and a source of the first thin film transistor;
   another side of the second capacitor is coupled to one side of the first capacitor; another side of the first capacitor is grounded;
   a gate of the third thin film transistor receives a first scanning signal, a source of the third thin film transistor and a source of the fourth thin film transistor receive a data voltage or an initialization voltage; a gate of the fourth thin film transistor receives a second scanning signal; a drain of the fourth thin film transistor is coupled to a drain of the first thin film transistor, a drain of the second thin film transistor, and a drain of the sixth thin film transistor;

a gate of the first thin film transistor is coupled to a node between the second capacitor and the first capacitor;

a source of the second thin film transistor is coupled to a node between the second capacitor and the first capacitor; a gate of the second thin film transistor receives the first scanning signal;

a gate of the sixth thin film transistor receives the third scanning signal; a source of the sixth thin film transistor is coupled to an anode of the OLED; a cathode of the OLED receives a negative voltage of the power source.

7. The AMOLED pixel driving circuit according to claim 6, wherein the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

8. The AMOLED pixel driving circuit according to claim 6, wherein the first thin film transistor, the second thin film transistor, the third thin film transistor, the fourth thin film transistor, the fifth thin film transistor, and the sixth thin film transistor are P-type thin film transistors.

9. The AMOLED pixel driving circuit according to claim 8, wherein the first scanning signal, the second scanning signal, and the third scanning signal correspond to an initializing stage, a threshold voltage storing stage, and a light illuminating stage respectively;
in the initializing stage, the first scanning signal and the second scanning signal are at a low potential, the third scanning signal is at a high potential;
in the threshold voltage storing stage, the first scanning signal is at a low potential, the second scanning signal and the third scanning signal are at a high potential;
in the light illuminating stage, the first scanning signal and the second scanning signal are at a high potential, the third scanning signal is at a low potential.

10. The AMOLED pixel driving circuit according to claim 9, wherein in the initializing stage, a source of the third thin film transistor and a source of the fourth thin film transistor receive the initialization voltage;
in the threshold voltage storing stage and the light illuminating stage, a source of the third thin film transistor and a source of the fourth thin film transistor receive the data voltage.

11. The AMOLED pixel driving circuit according to claim 6, wherein the first thin film transistor is a driving thin film transistor, the sixth thin film transistor is a switching thin film transistor.

12. The AMOLED pixel driving circuit according to claim 6, wherein the first scanning signal, the second scanning signal, and the third scanning signal are generated from an external timing controller.

13. An active matrix organic light-emitting diode (AMOLED) pixel driving method comprising:
providing an AMOLED pixel driving circuit;
entering an initializing stage;
entering a threshold voltage storing stage; and
entering a light illuminating stage;
wherein the AMOLED pixel driving circuit comprises:
a first thin film transistor, a second thin film transistor, a third thin film transistor, a fourth thin film transistor, a fifth thin film transistor, a sixth thin film transistor, a first capacitor, a second capacitor, and an organic light-emitting diode (OLED);

a gate of the fifth thin film transistor receives a third scanning signal, a source of the fifth thin film transistor receives a positive voltage of a power source, a drain of the fifth thin film transistor is coupled to one side of the second capacitor, a drain of the third thin film transistor, and a source of the first thin film transistor;

another side of the second capacitor is coupled to one side of the first capacitor; another side of the first capacitor is grounded;

a gate of the third thin film transistor receives a first scanning signal, a source of the third thin film transistor and a source of the fourth thin film transistor receive a data voltage or a initialization voltage; a gate of the fourth thin film transistor receives a second scanning signal; a drain of the fourth thin film transistor is coupled to a drain of the first thin film transistor, a drain of the second thin film transistor, and a drain of the sixth thin film transistor;

a gate of the first thin film transistor is coupled to a node between the second capacitor and the first capacitor;

a source of the second thin film transistor is coupled to a node between the second capacitor and the first capacitor; a gate of the second thin film transistor receives the first scanning signal;

a gate of the sixth thin film transistor receives the third scanning signal; a source of the sixth thin film transistor is coupled to an anode of the OLED; a cathode of the OLED receives a negative voltage of the power source;

in the initializing stage, the first scanning signal provides a low potential, the second thin film transistor and the third thin film transistor are on; the second scanning signal provides a low potential, the fourth thin film transistor is on; the third scanning signal provides a high potential, the fifth thin film transistor and the sixth thin film transistor are off; a voltage of the gate of the first thin film transistor and a voltage of the source of the first thin film transistor are equal to the initialization voltage;

in the threshold voltage storing stage, the first scanning signal provides a low potential, the second thin film transistor and the third thin film transistor are on; the second scanning signal provides a high potential, the fourth thin film transistor is off; the third scanning signal provides a high potential, the fifth thin film transistor and the sixth thin film transistor are off; a voltage of the source of the first thin film transistor is equal to the data voltage, a voltage of the gate of the first thin film transistor changes into Vdata−Vth, wherein the Vdata is the data voltage, Vth is a threshold voltage of the first thin film transistor;

in the light illuminating stage, the first scanning signal provides a high potential, the second thin film transistor and the third thin film transistor are off; the second scanning signal provides a high potential, the fourth thin film transistor is off; the third scanning signal provides a low potential, the fifth thin film transistor and the sixth thin film transistor are on; the OLED illuminates, wherein an electric current flowing through the OLED is irrelevant to the threshold voltage of the first thin film transistor.

14. The AMOLED pixel driving method according to claim 13, wherein in the light illuminating stage, a voltage applied to the source of the first thin film transistor changes into the positive voltage of the power source, and a voltage applied to the gate of the first thin film transistor changes into Vdata−Vth+δV so that electric current flowing through the OLED is irrelevant to the threshold voltage of the first thin film transistor, wherein δV is a variation of the voltage applied to the gate of the first thin film transistor as the voltage applied to the source of the first thin film transistor changing from the data voltage to the positive voltage of the power source.

15. The AMOLED pixel driving method according to claim 13, wherein in the initializing stage, a source of the third thin film transistor and a source of the fourth thin film transistor receive the initialization voltage;

in the threshold voltage storing stage and the light illuminating stage, a source of the third thin film transistor and a source of the fourth thin film transistor receive the data voltage.

16. The AMOLED pixel driving method according to claim 13, wherein the first scanning signal, the second scanning signal, and the third scanning signal are generated from an external timing controller.

17. The AMOLED pixel driving method according to claim 13, wherein the first thin film transistor is a driving thin film transistor, the sixth thin film transistor is a switching thin film transistor.

18. The AMOLED pixel driving method according to claim 13, wherein the first thin film transistor, the second thin film transistor, the third thin film transistor, the fourth thin film transistor, the fifth thin film transistor, and the sixth thin film transistor are low temperature poly-silicon thin film transistors, oxide semiconductor thin film transistors, or amorphous silicon thin film transistors.

19. The AMOLED pixel driving method according to claim 13, wherein the first thin film transistor, the second thin film transistor, the third thin film transistor, the fourth thin film transistor, the fifth thin film transistor, and the sixth thin film transistor are P-type thin film transistors.

\* \* \* \* \*